US009022232B2

(12) United States Patent
Chang et al.

(10) Patent No.: US 9,022,232 B2
(45) Date of Patent: May 5, 2015

(54) WAFER STOCKER

(75) Inventors: Sheng-Jung Chang, New Taipei (TW); Hang-Hao Feng, Taoyuan County (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 229 days.

(21) Appl. No.: 13/470,362

(22) Filed: May 14, 2012

(65) Prior Publication Data

US 2013/0175908 A1 Jul. 11, 2013

(30) Foreign Application Priority Data

Jan. 10, 2012 (TW) .............................. 101100951 A

(51) Int. Cl.
*H01L 21/677* (2006.01)

(52) U.S. Cl.
CPC ................................ *H01L 21/67769* (2013.01)

(58) Field of Classification Search
CPC ................... H01L 21/67769; H01L 21/67271; H01L 21/6773; Y10S 414/14
USPC .................... 211/26, 41.18; 414/940
See application file for complete search history.

(56) References Cited

U.S. PATENT DOCUMENTS

| | | | | |
|---|---|---|---|---|
| 4,934,767 | A * | 6/1990 | Hoyt et al. .................. | 312/330.1 |
| 5,261,935 | A * | 11/1993 | Ishii et al. ....................... | 96/400 |
| 6,129,496 | A * | 10/2000 | Iwasaki et al. ............ | 414/222.01 |
| 6,151,533 | A * | 11/2000 | Iwasaki et al. ................. | 700/214 |
| 6,169,935 | B1 * | 1/2001 | Iwasaki et al. ................. | 700/214 |
| 6,283,692 | B1 * | 9/2001 | Perlov et al. ............. | 414/222.01 |
| 6,431,814 | B1 * | 8/2002 | Christensen et al. ........... | 702/81 |
| 6,473,668 | B2 * | 10/2002 | Abuzeid et al. ............... | 700/121 |
| 6,516,243 | B2 * | 2/2003 | Chang et al. .................. | 700/217 |
| 6,520,727 | B1 | 2/2003 | Babbs | |
| 6,699,004 | B1 * | 3/2004 | Conboy et al. ................ | 414/757 |
| 6,726,429 | B2 * | 4/2004 | Sackett et al. ................ | 414/217 |
| 7,077,173 | B2 * | 7/2006 | Tokunaga ........................ | 141/66 |
| 7,440,932 | B2 * | 10/2008 | Gartland et al. ................ | 706/46 |
| 8,177,550 | B2 * | 5/2012 | Haraki et al. ................. | 432/239 |
| 8,702,365 | B2 * | 4/2014 | Park et al. ..................... | 414/217 |
| 2002/0094257 | A1 | 7/2002 | Babbs | |
| 2004/0073331 | A1 | 4/2004 | Chang | |
| 2005/0135906 | A1 * | 6/2005 | Fosnight et al. ............. | 414/277 |
| 2006/0182530 | A1 * | 8/2006 | Wang ............................ | 414/217 |
| 2007/0251116 | A1 * | 11/2007 | Huang et al. .................... | 34/202 |
| 2009/0028669 | A1 * | 1/2009 | Rebstock .......................... | 414/1 |
| 2009/0145050 | A1 * | 6/2009 | Dugand ......................... | 52/36.1 |

(Continued)

FOREIGN PATENT DOCUMENTS

JP 2003137411 5/2003
JP 2005277326 10/2005

*Primary Examiner* — Joshua Rodden
*Assistant Examiner* — Hiwot Tefera
(74) *Attorney, Agent, or Firm* — Winston Hsu; Scott Margo

(57) ABSTRACT

A wafer stocker is provided in present invention including a main body having an opening communicating with an inner accommodation space, a plurality of storage cells for wafer pod disposed in the main body, and an embedded storage shelf mounting in the accommodation space of the main body via the opening, the embedded storage shelf is provided with a plurality of storage cells for wafer pods which may combine with the storage cells in the main body to serve jointly as the storage cells of the entire wafer stocker, wherein the embedded storage shelf may be removed from the accommodation space to be replaced with an embedded wafer sorter.

2 Claims, 3 Drawing Sheets

(56) References Cited

U.S. PATENT DOCUMENTS

| | | | |
|---|---|---|---|
| 2009/0224920 A1* | 9/2009 | Chiang et al. | 340/572.1 |
| 2010/0202861 A1* | 8/2010 | Sawado et al. | 414/222.02 |
| 2011/0129321 A1* | 6/2011 | Rebstock | 414/305 |
| 2011/0236176 A1 | 9/2011 | Rebstock | |
| 2011/0286819 A1* | 11/2011 | Shibata et al. | 414/222.02 |

* cited by examiner

WAFER STOCKER

BACKGROUND OF THE INVENTION

1. Field of the Invention

The present invention relates generally to a wafer stocker. In particular, the present invention relates to a wafer stocker with an embedded storage shelf.

2. Description of the Prior Art

With the development of semiconductor process steps to very-large-scale integration (VLSI), the manufacture of integrated circuit becomes more complicated and difficult. It may need hundreds of processes to manufacture a circuit with high integrated density. The complicated processes will increase the complexity and impact the flexibility for WIP (Wafer-In-Process) dispatching and allocation. The wafers or pods in process are frequently moved between bays or process tools in the FAB depending on their current process step. Also, the wafers may be pended in current stage and be stopped in the planned course of the wafer fabrication flow because of capacity planning or unexpected inline issues. To respond to the above-mentioned situations, the wafer stocker is used as an equipment to temporarily store the wafers and provide a function of wafer transferring. The wafer stocker may be associated with an automatic material handling system (AMHS) to adjust the WIP according to the production line factors, such as process capability, tool layout, process planning, or alarm situation, in order to effectively improve the capacity utilization of the process tools.

Wafer stockers are usually disposed at each bay in the clean room of the FAB, which capacity depends on the requirement of each bay. In addition to the function of wafer storage, the wafer stocker may also be regarded as a transportation medium in each bay. The wafer pod (or FOUP) is transported via the wafer stocker to the next predetermined process tool or bay after completing the current process.

The number of wafer stockers and their storage cells primarily depends on the scale of the FAB and the design of the production line. The number and the position of each wafer stocker should be adapted to the tool group in each bay and the AMHS in order to obtain the most efficient configuration. Furthermore, the wafer stocker in nowadays 12-inch wafer FAB is usually provided with an additional wafer sorter to perform a pod splitting/merging step. The number and capability of the wafer sorter has a significant influence on the process performances. It is necessary to add or remove the wafer sorter from the wafer stocker according to the changes in process capability, tool distribution or process planning.

Accordingly, in order to install wafer sorters in wafer stockers, the conventional approach is to make some room in the wafer stocker to accommodate the wafer sorter. This space will be reserved until the wafer sorter needs to be installed. For this kind of conventional method, the reservation of the accommodation space is undoubtedly a waste of the space in wafer stocker. Moreover, the above-mentioned conventional installation method is labor-cost work and quite time-consuming, which can't therefore meet the requirement of high capacity utilization of nowadays wafer FAB and Cost Management.

SUMMARY OF THE INVENTION

In order to overcome the above-mentioned drawbacks of the prior art, a novel wafer stocker is provided in the present invention. The wafer stocker includes a predetermined accommodation space for a modular embedded storage shelf or an embedded wafer sorter to be mounted therein, thereby facilitating the retrofitting of wafer stocker. The necessary time and cost are also saved.

One objective of the present invention is to provide a wafer stocker including a main body having an opening communicating to an inner accommodation space, a plurality of storage cells for wafer pods disposed in the main body, and an embedded storage shelf mounted in the accommodation space of the main body via the opening, the embedded storage shelf is provided with a plurality of storage cells for wafer pods which may combine with the storage cells in the main body to serve jointly as the storage cells of the entire the wafer stocker, wherein the embedded storage shelf may be removed from the accommodation space to be replaced with an embedded wafer sorter.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
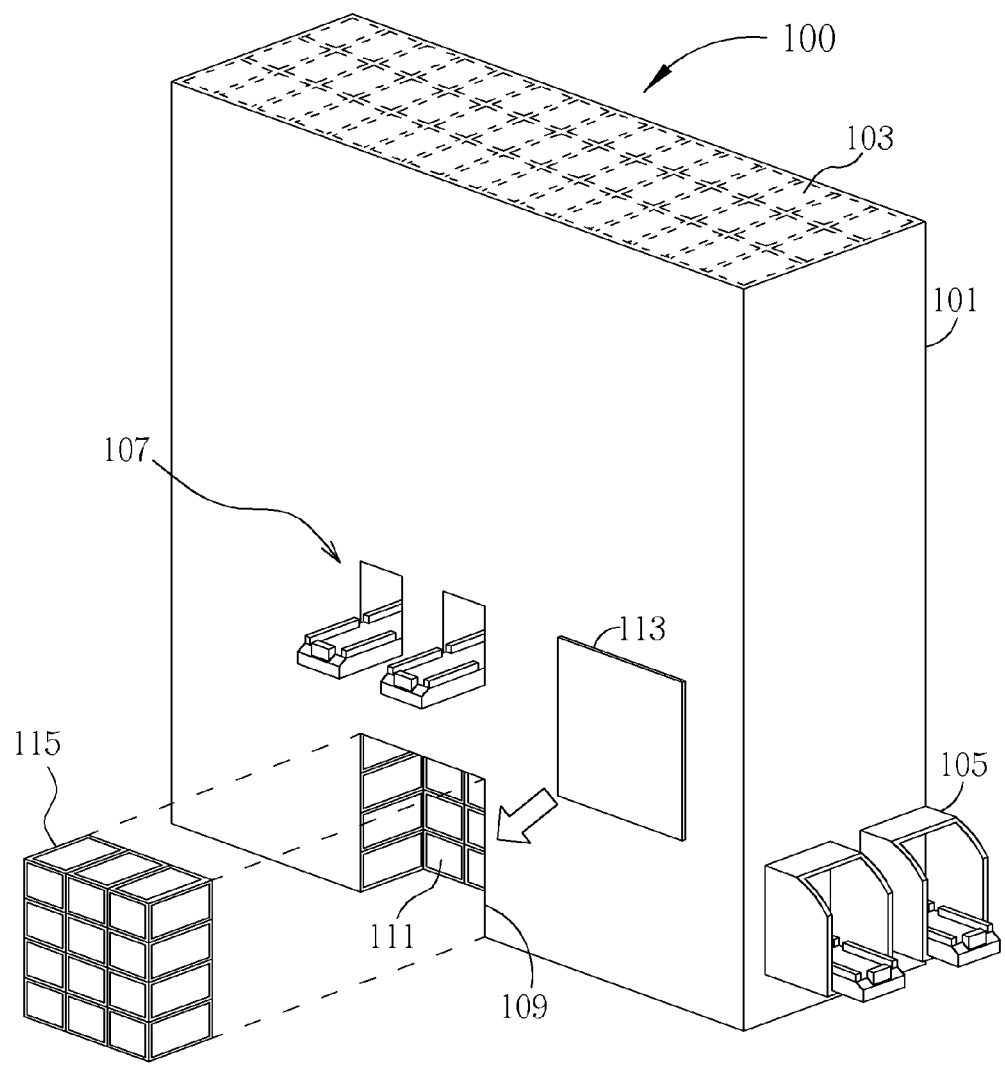
FIG. 1 is a prospective view illustrating a wafer stocker and an embedded storage shelf in accordance with one preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings which form a part of the disclosure, and in which is shown, by way of illustration, specific embodiments in which the invention may be practiced. These embodiments are described in sufficient details to enable those skilled in the art to practice the invention. It should be understood that other embodiments may be utilized and structural, logical, and electrical changes may be made without departing from the scope of the present invention. The following detailed description is, therefore, not to be taken in a limiting sense, and the scope of the present inventions is defined only by the appended claims.

First, please refer to FIG. 1, which is a prospective view illustrating the installation of an embedded storage shelf into a wafer stocker. The wafer stocker 100 in the present invention is an automated storage/retrieval system (AS/RS) specifically used to store the wafer product in the wafer FAB. The wafer stockers 100 are mostly disposed at inter-bays in the FAB and may be controlled manually or automatically by operators or automatic material handling system (AMHS) to load/unload the wafer pods. The wafer stockers 100 may be installed with wafer sorters to enable the functions of wafer splitting and merging.

The main body 100 of a wafer stocker 101 is a housing, such as the rectangle housing shown in FIG.1. A plurality of storage cells 103 are provided in the main body 100 to store the wafer pods, such as front opening unified pods (FOUPs). In the present invention, the main body 101 may also be mounted with other tools, such as two manual loading ports 105 mounted in the front side of the main body 101 for operators to load/unload the wafer pods manually from the wafer stocker 100, and two automatic loading ports 107 mounted on the lateral side of main body 101 at a predetermined altitude may connect with an overhead hoist transport (OHT) system to load/unload the wafer pods automatically via the system. The main body 101 may also be provided with a transport mechanism, such as a crane or a trail, to carry the wafer pods. For the sake of simplicity, some components are omitted in the figure.

As shown in FIG.1, in the present invention, one side of the main body 101 is provided with an opening communicating with a predetermined inner accommodation space 111. The accommodation space 111 is used for installing an embedded storage shelf or an embedded wafer sorter and may be shielded by a cover plate 113. An embedded storage shelf 115 may be installed in the accommodation space 111 inside the main body 101 or may be removed therefrom.

Figure 2:
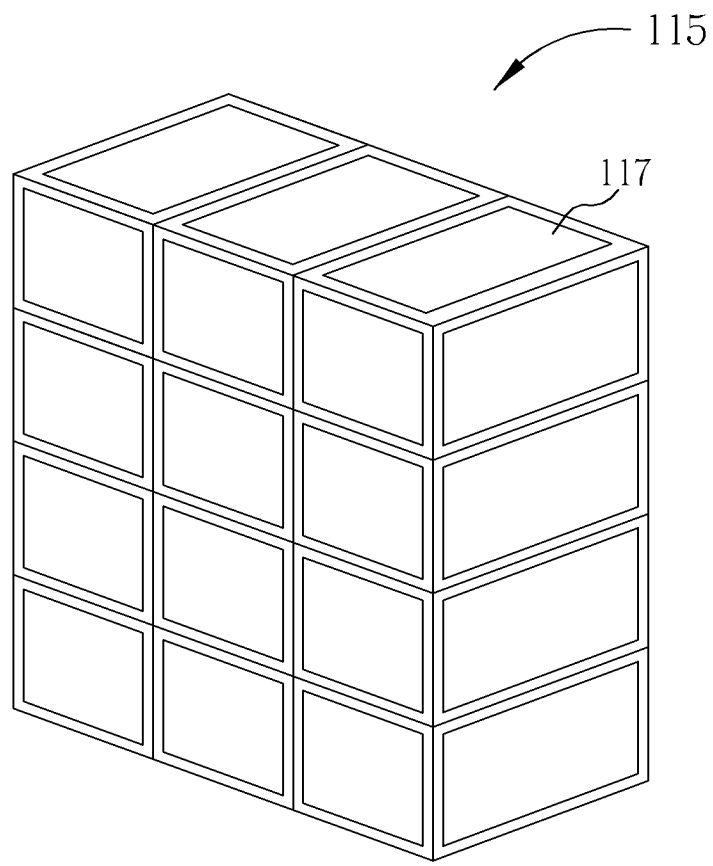
FIG. 2 is a prospective view illustrating a embedded storage shelf in accordance with one preferred embodiment of the present invention.

Please refer to FIG. 2, which is a prospective view illustrating an embedded storage shelf in accordance with the present invention.

As shown in FIG.2, the embedded storage shelf 115 is a shelf consisting of a plurality of storage cells 117 (as the 4×3×1 storage cells shown in the figure) and may be mounted in the main body 101 by fasteners, such as screws or latches. The storage cell 117 in embedded storage shelf 115 is identical to the storage cell 103 in the main body 101. Both of them are used to store wafer pods. When the embedded storage shelf 115 is installed inside the wafer stocker, the storage cells 117 of the embedded storage shelf 115 may combine with the storage cells 103 in the main body 101 to serve jointly as the storage cells of the entire wafer stocker 100.

Figure 3:
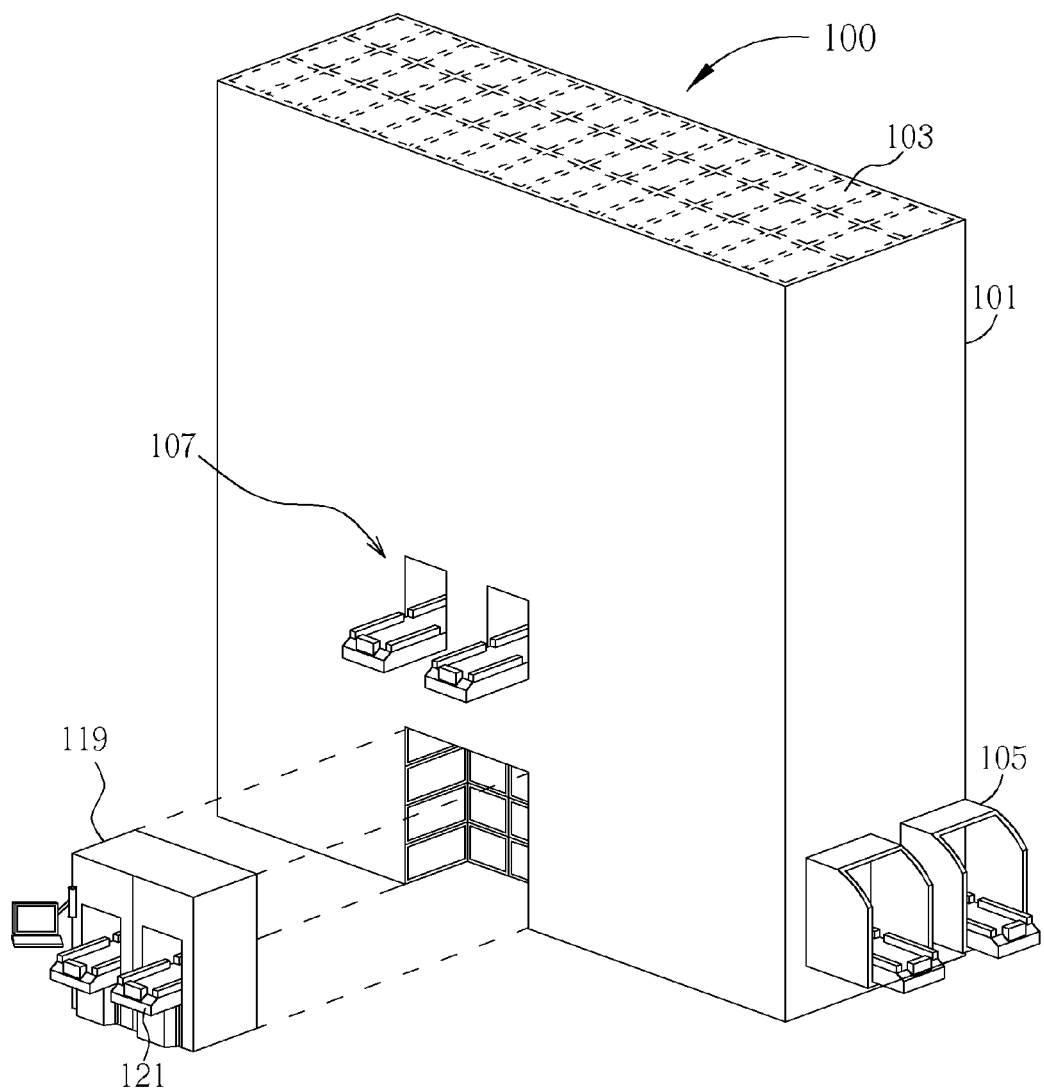
FIG. 3 is a prospective view illustrating the installation of a wafer sorter into a wafer stocker in accordance with one preferred embodiment of the present invention.

Please refer to FIG.3, which is a prospective view illustrating the installation of an embedded wafer sorter into a wafer stocker in accordance with a preferred embodiment of the present invention. As shown in FIG.3, when the embedded storage shelf 115 is removed from the wafer stocker, an accommodation space 111 is left inside the main body 101, which may be used for installing an embedded wafer sorter 119. The wafer sorter 119 may perform the action of wafer splitting/merging for the wafers stored in the wafer stocker 100. During the wafer splitting/merging, the wafer pod is loaded or unloaded via two loading ports 121 mounted on the wafer sorter 119. The wafers in the loaded wafer pod are then transferred into/out of the wafer pod by arms in the wafer sorter. The installed embedded wafer sorter 119 is communicating with the wafer stocker 100 via a transmission line compatible with the E84 data communications protocol, so that the information, such as the selected storage cells or the slots for wafer pods or wafer, may be correctly accessed.

The primary feature of present invention is to provide a Plug & Play (PnP) embedded storage shelf. This shelf maybe installed into the corresponding wafer stocker to serve as common storage cells. When the wafer sorter is required to be installed in the wafer stocker due to production line issues such as a change of process capability, the tools layout, or capacity planning, the embedded storage shelf may be removed easily from the wafer stocker to be replaced with a wafer sorter. The advantage of this design is that the embedded storage shelf may be installed in the accommodation space once reserved for the wafer sorter. This way, the inner space and the available number of storage cells in the wafer stocker will not be wasted. Furthermore, the design of the Plug & Play embedded storage shelf may facilitate the installation and relocation of the embedded wafer sorter. When a wafer sorter is required in the wafer stocker, the conventional installation steps, such as the hole-drilling and the evacuation of wafer pods, is no longer required. The operator only needs to remove the embedded storage shelf once installed in the wafer stocker and replace it with an embedded sorter. This simple step undoubtedly saves time and cost for retrofitting the wafer stocker.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wafer stocker, comprising:
    a main body having an opening communicating with an inner accommodation space;
    a plurality of storage cells for wafer pods disposed in said main body;
    an embedded storage shelf mounted in said accommodation space of said main body via said opening, said embedded storage shelf is provided with a plurality of storage cells for wafer pods, wherein each said storage cell of said embedded storage shelf is identical to said storage cell in said main body to combine said the storage cells in said main body to serve jointly as the storage cells of the entire said wafer stocker; and
    an embedded wafer sorter configured to be installed in said accommodation space when said embedded storage shelf is removed.

2. The wafer stocker according to claim 1, wherein said embedded storage shelf is a Plug & Play embedded storage shelf.

* * * * *